United States Patent [19]

Kochel et al.

[11] 4,148,133

[45] Apr. 10, 1979

[54] POLYSILICON MASK FOR ETCHING THICK INSULATOR

[75] Inventors: Leroy J. Kochel, Fridley; Harvey W. Kalweit, Minneapolis; Arthur D. Gonzales, Inver Grove Heights; Clyde L. Church, Apple Valley, all of Minn.; Paul H. Ou-Yang, Sunnyvale, Calif.

[73] Assignee: Sperry Rand Corporation, New York, N.Y.

[21] Appl. No.: 904,085

[22] Filed: May 8, 1978

[51] Int. Cl.² .................................... H01L 21/02
[52] U.S. Cl. ............................ 29/571; 148/187; 156/657
[58] Field of Search ............... 148/187; 156/657; 29/571

[56] References Cited

U.S. PATENT DOCUMENTS

| 3,475,234 | 10/1969 | Kerwin et al. | 148/187 |
|---|---|---|---|
| 3,753,807 | 8/1973 | Hoare et al. | 148/188 |
| 3,886,000 | 5/1975 | Bratter et al. | 148/175 |
| 3,898,105 | 8/1975 | Mai et al. | 148/1.5 |
| 3,940,288 | 2/1976 | Takagi et al. | 148/1.5 |
| 3,966,501 | 6/1976 | Nomura et al. | 148/1.5 |
| 4,039,358 | 8/1977 | Kitajima et al. | 148/187 |
| 4,050,967 | 9/1977 | Rosnowski et al. | 148/189 |
| 4,062,707 | 12/1977 | Mochizuki et al. | 29/571 X |

Primary Examiner—G. Ozaki
Attorney, Agent, or Firm—Douglas L. Tschida; Kenneth T. Grace; Marshall M. Truex

[57] ABSTRACT

An improved method is disclosed for etching the thick field insulator films of silicon-oxy-nitride, during the fabrication process of metal oxide semiconductor (MOS) devices, wherein a polycrystalline silicon etch mask is used in conjunction with an acid etchant to etch the gate and interconnect openings through the thick field insulator to the source, gate and chain regions of the MOS devices for a memory array.

6 Claims, 5 Drawing Figures

POLYSILICON MASK FOR ETCHING THICK INSULATOR

SUMMARY OF THE INVENTION

An improved method is taught for etching thick field insulator films of silicon-oxy-nitride, which produces cleaner and better defined source, drain and gate interconnection openings when incorporated as a process step in the fabrication of insulated gate field effect transistors. The method requires the sequential deposition of a layer of polycrystalline silicon over a thick film field insulator of silicon-oxy-nitride; selectively etching the polysilicon to form an etch mask over the field insulator; etching the thick field insulator with an acid etchant to expose the substrate; oxidizing the remaining polysilicon in steam; and stripping the grown oxide from the silicon-oxy-nitride and the substrate.

BACKGROUND OF THE INVENTION

In the production of an insulated gate field effect transistor memory of the type described in U.S. Pat. No. 3,508,211 and comprised of metal nitride oxide semiconductor (MNOS) memory devices having gate structures similar to that described in U.S. Pat. No. 3,590,337, a thick film field insulator is grown over a silicon substrate containing doped source and drain regions, using a process similar to that described in U.S. Pat. No. 3,573,096. The field insulator serves to electrically isolate the conductive paths of the MOS structure from the doped regions and to minimize the parasitic capacitance, therefore requiring the selection of a material of an appropriate dielectric constant and thickness to achieve this result. Using a thick field insulator in excess 1 micron reduces the parasitic capacitance in devices requiring large gate turn on voltages, but at the same time makes it more difficult to etch the necessary openings in the insulator to enable the interconnections to the source and drain regions and the formation of the appropriate gate structure.

Using thick films of silicon-oxy-nitride as the field insulator produces the above difficulties in that it becomes very difficult to etch clean, well defined openings. The difficulty arises in that the thick films require long etch times, and commonly used etch masks will not hold up over these prolonged periods. The use of standard photo-resist techniques require repeated rebaking steps, as the photo-resist tends to float away, and attempts at using aluminum etch masks have resulted in sporadic early deterioration of the mask. Attempts have also been made to combine an aluminum mask with a partial dry plasma etch before completing the etch with a wet etch, but undesirable charge accumulates at the walls of the gate openings, which charge adversely affects the electrical characteristics of the array.

To overcome these problems, it has been determined that a polycrystalline silicon etch mask can be grown over the silicon-oxy-nitride field insulator. The use of such a mask requires additional process steps but is advantageous in that the etch rate of the polysilicon mask is significantly lower than that of the field insulator, the mask can be laid down sequentially or in situ with the insulator and the crystalline structures of the insulator and mask are sufficiently compatible so that the mask won't float away over the prolonged etch periods.

While the use of a polysilicon mask requires the additional process steps of the preparation of the mask, the oxidizing of the polysilicon mask after the etch period and stripping the oxide to remove the mask, this additional thermal oxidation serves to clean the interconnect openings and the gate opening by removing the exposed portion of the substrate, which contains defects such as scar, crack, distortion and dislocation that occur at the substrate-insulator interface during the growth of the insulator. This cleaning tends to minimize pinholes in the subsequently grown gate oxide, in the manner as taught by Katajima, et al, in U.S. Pat. No. 4,039,358.

Polysilicon films have been used in the prior art as electrical interconnects, diffusion masks, ion implant masks and self aligning acid etch masks, but the inclusion of a polysilicon mask in a MOS process as an acid etch mask for etching the thick field insulator of the MOS structure is unique.

Reference is called to U.S. Pat. No. 3,475,234 issued to R. E. Kerwin, et al, where a method for making MIS structures is disclosed that teaches the use of a polysilicon film 16 as a gate electrode and as an acid etch mask in a self limiting etch technique based on the use of a differential etchant. The polysilicon 16 is used to form the self aligned gate structure 17 and to locate the gate structure 17 in the central position of the channel by overcoming any misalignment that occurs during the photo-resist mask Step 7 of FIG. 2. The polysilicon 16 is then used in steps 9 and 10 as an acid etch mask for sequentially etching layers 14 and 13 to form the complete gate structure 17. It is to be noted however, that in Step 8, where the polysilicon 16 acts as an acid etch mask for overcoming the misalignment of photo-resist mask from Step 7, the acid etch of the 0.2 micron field insulator 15 in Step 8 does produce a result similar to that described in the present invention. The principal use of the polysilicon 16 is to form a mask for defining the source, drain and gate areas, but it can be used to correct for any misalignment that might occur in Step 7. The use of the polysilicon for the corrective etching of the field insulator 15 is advantageous, but it is to be recognized that in Steps 4 and 5, where the field insulator 15 is initially etched to produce the gate opening, a standard photo-resist masking operation is used rather than the polysilicon masking procedure disclosed by the present invention. The method and structure disclosed by Kerwin would therefore have the same etching difficulties, which are removed by the present invention, especially if the field insulator 15 thickness were increased to the suggested 4 to 5 microns. The use of a polysilicon acid etch mask in the manner described hereinafter further produces openings in the field insulator of improved quality and with greater yields.

DESCRIPTION OF THE PREFERRED EMBODIMENT

Figure 1:
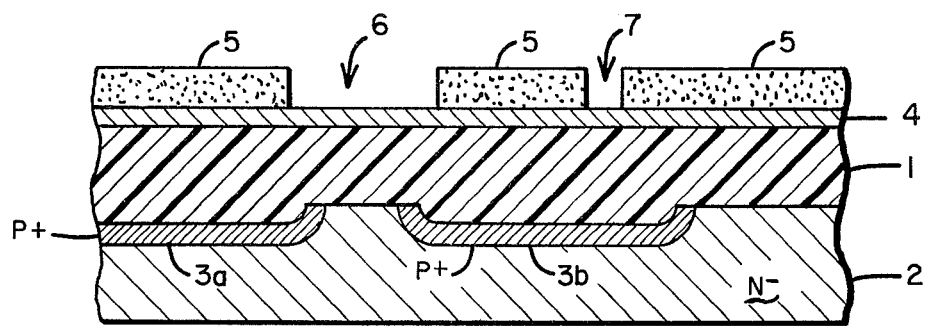
FIG. 1 is a cross sectional view of a polysilicon film with patterned photo-resist applied thereon.

The method for etching the thick field insulator of an MOS memory array comprised of insulated gate field effect transistors will now be described with particularity with reference to the drawings. In the fabrication of such a memory array requiring large gate turn-on voltage, a thick film silicon-oxy-nitride (SiON) field insulator 1 on the order of 1.75 microns is used to provide electrical isolation between the active regions on the die and the conductive paths and provide a large interface charge, $Q_{SS}$, which occurs at the boundary between the substrate 2 and field insulator 1. For FIG. 1 a typical array is fabricated by selectively doping a single crystal substrate 2 at selected regions wherein the source and drain 3b regions are located. Subsequently a uniform thick film field insulator 1 of SiON, typically on the order of 2.2 microns, is deposited over the substrate 2 by a chemical vapor deposition (CVD) process such as described in the U.S. Pat. No. 3,573,096. The film grown in the CVD process consists of approximately 96% SiN to 4% $O_2$, which provides a $Q_{SS}$ of approximately 9 to $12 \times 10''$ charges/$cm_2$.

Because it then becomes necessary to cut openings through the SiON to expose the diffused source 3a and drain 3b regions contained in the substrate 2 and enable the subsequent fabrication of the interconnect metallization and the fixed and variable threshold gate structures of the insulated gate field effect transistors, an appropriate masking and etch sequence must be performed to cut clean, geometrically well defined openings. Attempts have been made using standard photo-resist mask techniques but due to the long etch times that are required with a wet etch of 7:1 ammonium fluoride to hydrofluoric acid ($NH_4OH$), the thick films of photo-resist break down and float away before the etch step is complete, therefore repeated rebaking of the photo-resist and additional physical handling of the wafer are required, which adds to the total process time and reduces yield.

Attempts have also been made with an aluminum etch mask, but the thickness of the aluminum deposition has proved to be critical in that the aluminum mask sporadically etches faster than the SiON at minimum metal thicknesses. A metal etch mask is not desirable however, in that the possibility always exists of metal mask residue being left in the gate openings after the etching, which residue will prove deleterious to the electrical operation of the completed die. Efforts to do a partial dry plasma etch using a minimum thickness aluminum mask and then completing with the wet 7:1 of $NH_4OH$:HF acid etch also proved unsuccessful in that charges tended to form on the walls of gate openings during the partial plasma etch, which subsequently produced leakage currents in the micro-amp range.

Figure 2:
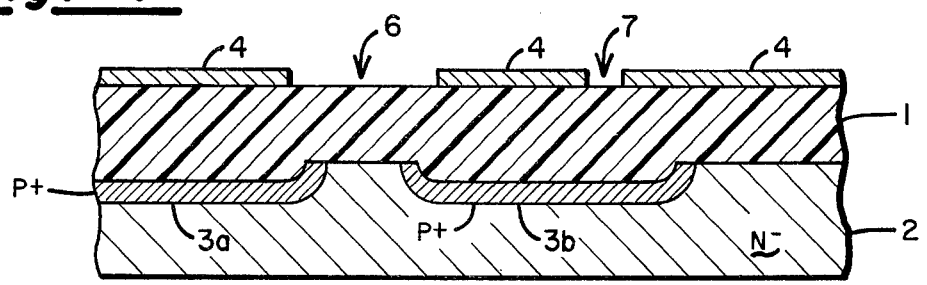
FIG. 2 is a cross sectional view of the prepared polysilicon mask.

The use of a polysilicon etch mask proves to be the most advantageous approach to solving the problem and producing improved yield during the combination cut step in which the required gate 6 and interconnect 7 openings are etched in the SiON field insulator 1. After the SiON 1 is deposited on the prepared substrate 2 of FIG. 1, a film of polysilicon 4 is sequentially deposited, which can be done in situ, over the SiON to a thickness on the order of 1000 to 1200 A. The thickness of the polysilicon 4 can be adjusted depending on the thickness of the field insulator 1. A photo-resist 5 is applied over the polysilicon 4 and exposed via an appropriate photo mask to locate the desired openings 6 and 7 in the polysilicon 4. The unexposed photo-resist 5 is etched away and then the polysilicon 4 is etched with a 20:20:1:1:1 of $C_2H_4O_2$:$HNO_3$:$H_2O$:HF: saturated solution of I in $C_2H_2O_2$ acid etch to produce the desired polysilicon 4 etch mask, see FIG. 2.

Figure 3:
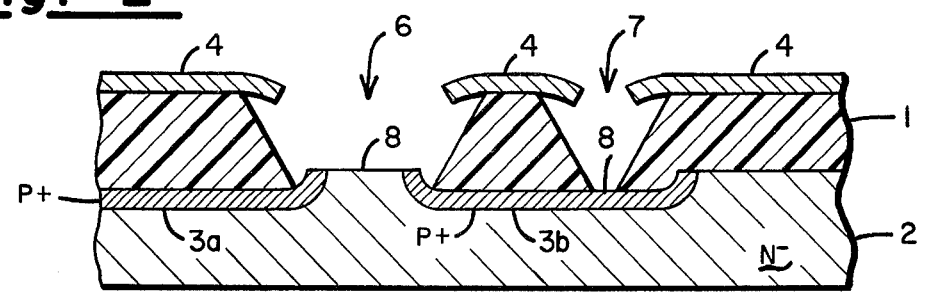
FIG. 3 is a cross sectional view of the etched thick film field insulator.

The wafer is next subjected to a 7:1 of $NH_4F$:HF acid etch for approximately 30 to 55 minutes until the SiON 1 is completely removed down to the substrate 2. Typical gate 6 and interconnect 7 openings etched in this manner are shown in FIG. 3, wherein the acid has produced some undercutting of the polysilicon 4 mask. With the 30 to 55 minute etch time required for 2.2 microns of SiON the undercut will be tapered from approximately 2 microns at the polysilicon mask 4 field insulator 1 interface to 0.5 microns at the substrate 2 field insulator 1 interface. This large overhang is undesirable in that the unsupported polysilicon 4 will sag into the etched openings 6 and 7, therefore requiring the removal of the polysilicon 4 mask before additional process steps can occur. If the polysilicon 4 were permitted to remain, as suggested by Kerwin in U.S. Pat. No. 3,475,234, the subsequent metalization steps would result in inoperative devices with defective gate structures and interconnects.

Figure 4:
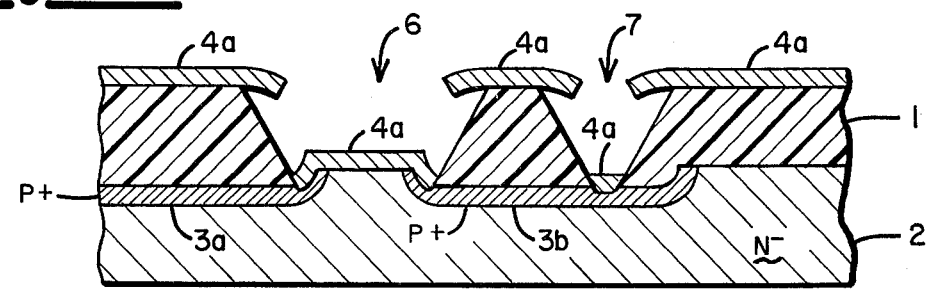
FIG. 4 is a cross sectional view of the device after oxidation of the polysilicon and exposed substrate.

It next becomes necessary to remove the polysilicon 4 mask, which is relatively unaffected by the 7:1 of $NH_4F$:HF acid etch since its etch rate is significantly slower than that of the SiON 1. To remove the polysilicon 4 mask, the polysilicon 4 is oxidized for approximately 5 minutes in steam at 1050° C., see FIG. 4. During the oxidation of the polysilicon 4, the etched openings 6 and 7 and partially exposed source-drain depositions 3a and 3b are also oxidized, and a thin film 4a of $SiO_2$ is formed. The $SiO_2$ film 4a is next removed by etching with a 7:1 of $H_2O$:HF acid etch.

Figure 5:
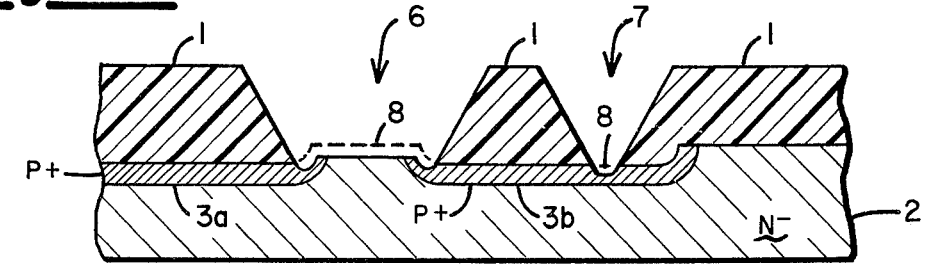
FIG. 5 is a cross sectional view of the device with etched gate and interconnect openings.

The final etched openings 6 and 7 can be seen in FIG. 5, and while only a single gate 6 and interconnect 7 opening are shown, it is to be recognized that all the required openings through the SiON field insulator 1 are etched at the same time.

The etched openings produced using the above described polysilicon mask and method have significantly improved the geometric definition of the cuts and the resulting yield, from 25% to on the order of 70% to 90% during the combination cut step, due to cleaner openings and a reduction in the amount of the necessary physical handling of the wafers, while increasing total process time by approximately only eight minutes.

An additional advantage occurs in that the oxidation step required to remove the polysilicon mask produces cleaner openings in that dislocations, scar and other defects, which can result in pinholes in the $SiO_2$ gate insulator of completed field effect transistors, are removed in a manner similar to that described in U.S. Pat. No. 4,039,358. This results since the oxidation of the wafer in FIG. 4 in steam consumes a portion of the exposed surface of the substrate 2, which contains the defects and which is stripped away during the subsequent 7:1 of $H_2O$:HF etch, thereby forming the openings 6 and 7 of FIG. 5. The consumed portion of the substrate surface 8 can be more clearly seen with reference to FIGS. 4 and 5. The subsequent formation of a gate structure in opening 6 requiring a deposition of $SiO_2$ will therefore be relatively defect free.

What is claimed is:

1. An improved method for etching a field insulator in a metal oxide semiconductor fabrication process, comprising:

providing a silicon substrate having an insulator formed over said substrate;

forming a layer of polycrystalline silicon over said field insulator;

etching a plurality of openings through said layer of polycrystalline silicon to form a mask for etching said field insulator;

etching said field insulator to expose portions of said substrate;

oxidizing said layer of polycrystalline silicon and the exposed portions of said substrate and said regions of second conductivity type;

stripping said oxidized layer of polycrystalline silicon from said field insulator and from said exposed portions of said substrate.

2. A method as set forth in claim 1, wherein said etching and stripping is performed with an etchant of the fluoric acid group.

3. A method as set forth in claim 1, wherein said field insulator is silicon-oxy-nitride.

4. A method as set forth in claim 1, wherein said field insulator is in excess of 1 micron.

5. A method for fabricating an insulated metal gate MOS transistor, comprising:

providing a silicon substrate of one conductivity type containing a source and a drain region of a second conductivity type in said substrate and having a silicon-oxy-nitride field insulator formed over said substrate;

forming a layer of polycrystalline silicon over said field insulator;

etching a plurality of openings through said layer of polycrystalline silicon to form a mask for etching said field insulator;

etching said field insulator to expose portions of said substrate and said source and drain regions;

oxidizing said layer of polycrystalline silicon and the exposed portions of said substrate and said source and drain regions;

stripping said oxidized layer of polycrystalline silicon from said field insulator and from said exposed portions of said substrate and said source and drain regions;

forming a gate insulator overlying the substate between the source and drain regions; and selectively depositing a metal over the exposed source and drain regions and the gate insulation structure.

6. A method as set forth in claim 5 wherein the field insulator is in excess of 1 micron.

* * * * *